(12) United States Patent
Xue et al.

(10) Patent No.: US 10,096,466 B2
(45) Date of Patent: Oct. 9, 2018

(54) PULSED PLASMA FOR FILM DEPOSITION

(71) Applicant: APPLIED MATERIALS, INC., Santa Clara, CA (US)

(72) Inventors: Jun Xue, San Jose, CA (US); Ludovic Godet, Sunnyvale, CA (US); Srinivas Nemani, Sunnyvale, CA (US); Michael W. Stowell, Loveland, CO (US); Qiwei Liang, Fremont, CA (US); Douglas A. Buchberger, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/073,444

(22) Filed: Mar. 17, 2016

(65) Prior Publication Data

US 2016/0276150 A1    Sep. 22, 2016

Related U.S. Application Data

(60) Provisional application No. 62/134,381, filed on Mar. 17, 2015.

(51) Int. Cl.
*H01L 21/00* (2006.01)
*H01L 21/02* (2006.01)
*H01L 21/768* (2006.01)

(52) U.S. Cl.
CPC .... *H01L 21/02274* (2013.01); *H01L 21/0217* (2013.01); *H01L 21/0234* (2013.01); *H01L 21/02329* (2013.01); *H01L 21/76826* (2013.01); *H01L 21/76829* (2013.01); *H01L 21/76831* (2013.01)

(58) Field of Classification Search
CPC .......... H01L 21/0234; H01L 21/02274; H01L 21/02329; H01L 21/0217; H01L 21/02
See application file for complete search history.

(56) References Cited

U.S. PATENT DOCUMENTS 5,014,217 A  *  5/1991  Savage ................. C23C 16/52
                                              204/192.33
2003/0186561 A1    10/2003  Law et al.
2004/0137167 A1 *  7/2004  Nguyen ............ C23C 16/45538
                                              427/569

(Continued)

OTHER PUBLICATIONS

International Search Report and Written Opinion dated May 30, 2016 for PCT Application No. PCT/US2016/022952.

*Primary Examiner* — Charles Garber
*Assistant Examiner* — Abdulfattah Mustapha
(74) *Attorney, Agent, or Firm* — Moser Taboada; Alan Taboada

(57) ABSTRACT

Methods of processing a substrate are provided herein. In some embodiments, a method of processing a substrate disposed in a processing chamber includes: (a) depositing a layer of material on a substrate by exposing the substrate to a first reactive species generated from a remote plasma source and to a first precursor, wherein the first reactive species reacts with the first precursor; and (b) treating all, or substantially all, of the deposited layer of material by exposing the substrate to a plasma generated within the processing chamber from a second plasma source; wherein at least one of the remote plasma source or the second plasma source is pulsed to control periods of depositing and periods of treating.

24 Claims, 5 Drawing Sheets

(56) References Cited

U.S. PATENT DOCUMENTS

| | | | |
|---|---|---|---|
| 2009/0104790 A1* | 4/2009 | Liang | C23C 16/34 |
| | | | 438/788 |
| 2009/0280267 A1* | 11/2009 | Li | C23C 16/32 |
| | | | 427/535 |
| 2011/0070380 A1 | 3/2011 | Shero et al. | |
| 2012/0196048 A1 | 8/2012 | Ueda | |
| 2013/0217239 A1* | 8/2013 | Mallick | H01L 21/02123 |
| | | | 438/778 |
| 2014/0213070 A1 | 7/2014 | Hong et al. | |
| 2015/0140836 A1* | 5/2015 | Niyogi | H01L 21/3105 |
| | | | 438/779 |

\* cited by examiner

PULSED PLASMA FOR FILM DEPOSITION

CROSS-REFERENCE TO RELATED APPLICATIONS

This application claims benefit of U.S. provisional patent application Ser. No. 62/134,381, filed Mar. 17, 2015, which is herein incorporated by reference in its entirety.

FIELD

Embodiments of the present disclosure generally relate to deposition processes, such as chemical vapor deposition (CVD), and more particularly, to improvements in the deposition of a material on a substrate.

BACKGROUND

Integrated circuits (ICs) have evolved into complex circuitry that can include millions of components on a chip. The evolution of chip designs continually necessitates faster circuitry and greater circuit densities. The demand for greater circuit densities, in turn, necessitates reductions in the dimensions of integrated circuit components, which includes reductions in the sizes of the features that comprise the integrated circuit components.

The reduced feature sizes of the integrated circuit components have presented new problems in the fabrication of such components. The smaller features often have higher aspect ratios that are more difficult to fill in with materials deposited during subsequent processing. Additionally, the decrease in feature sizes also restricts the total time that the integrated circuit may be subjected to higher temperature (e.g., above 450° C.) processes, known as the thermal budget. The reduced thermal budget limits the time allowed for reflowing of the deposited materials to fill in the higher aspect ratio features.

Therefore, processes have been developed to deposit films having greater flow capability. However, such deposited films often use post-deposition processing to improve the quality of the deposited films. The inventors have observed that the additional post-deposition processing is often carried out at higher temperatures and undesirably consume part of the thermal budget at the expense of the remaining thermal budget available for other steps in the fabrication of the integrated circuit. The inventors have further observed that the post-deposition processing often includes higher energy processes that can damage the structure of the device features.

Accordingly, the inventors have provided improved methods for depositing a material on a substrate with improved film quality.

SUMMARY

Methods of processing a substrate are provided herein. In some embodiments, a method of processing a substrate disposed in a processing chamber includes: (a) depositing a layer of material on a substrate by exposing the substrate to a reactive species generated from a remote plasma source and a first precursor, wherein the reactive species reacts with the first precursor; and (b) treating all, or substantially all, of the deposited layer of material by exposing the substrate to a plasma generated within the processing chamber from a second plasma source; wherein at least one of the remote plasma source or the second plasma source is pulsed to control periods of depositing and periods of treating.

In some embodiments, a method of depositing a material disposed atop a substrate support pedestal on a substrate includes: (a) depositing a layer of material on a substrate by exposing the substrate to a reactive species generated from a remote plasma source and a first precursor, wherein the reactive species reacts with the first precursor; (b) treating all, or substantially all, of the deposited layer of material by exposing the substrate to a plasma generated within the processing chamber from a second plasma source; wherein the remote plasma source is pulsed for a first interval and the second plasma source is pulsed for a second interval concurrent with the first interval; and (c) repeating (a) and (b) until a predetermined thickness of the material is deposited and treated on the substrate, wherein a temperature of the substrate support pedestal during (a)-(c) is controlled from about −150 degrees Celsius to about 500 degrees Celsius.

In some embodiments, a non-transitory computer readable medium having instructions stored thereon that, when executed, cause a method for processing a substrate disposed atop a substrate support pedestal in a processing chamber to be performed. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
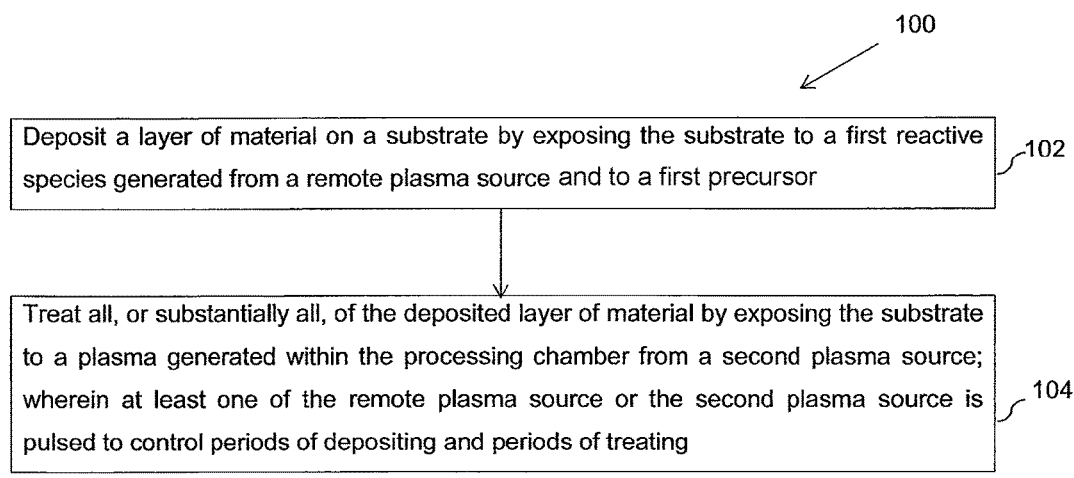
FIG. 1 is a flow chart for a method for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure advantageously provide improved methods of depositing a material on a substrate. Embodiments of the present disclosure also advantageously provide methods of depositing a material on a substrate with improved film quality. Embodiments of the present disclosure further advantageously provide methods of depositing at a lower temperature a material on a substrate. Embodiments of the present disclosure also advantageously provide methods for lower temperature deposition of a material on a substrate without high temperature post-deposition processing. Embodiments of the present disclosure also advantageously provide methods for deposition of a material on a substrate with improved film quality without a high temperature or high-energy post-deposition process. As described in greater detail below, a material may be deposited in a process chamber and also treated in the process chamber using a pulsed plasma.

FIG. 1 illustrates a flow chart of a method for processing a substrate in accordance with some embodiments of the present disclosure. The method 100 may be performed in any suitable process chambers configured for one or more of chemical vapor deposition (CVD) or plasma enhanced atomic layer deposition (PEALD). Exemplary processing systems that may be used to perform the inventive methods disclosed herein may include, but are not limited to, those of the ENDURA®, CENTURA®, or PRODUCER® line of processing systems, and the ETERNA® process chambers, all commercially available from Applied Materials, Inc., of Santa Clara, Calif. Other process chambers, including those from other manufacturers, may also be suitably used in connection with the teachings provided herein. The method may be carried out using, for example, the process chamber shown in FIG. 3 described below.

Figure 4A:
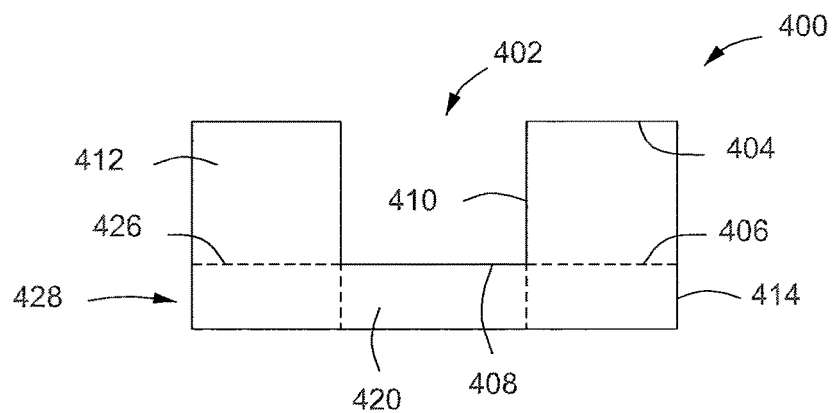
FIG. 4A-C depict a side cross-sectional view of an interconnect structure formed in a substrate in accordance with some embodiments of the present disclosure.

The method 100 may be performed on a substrate 400, as depicted in FIG. 4A, having a feature 402 formed in a first surface 404 of the substrate 400 and extending into the substrate 400 towards an opposing second surface 406 of the substrate 400. The substrate 400 may be any substrate capable of having material deposited on the substrate 400, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

The substrate 400 may be any suitable substrate having a feature 402 formed in the substrate. For example, the substrate 400 may comprise one or more of a dielectric material, silicon (Si), metals, or the like. In addition, the substrate 400 may include additional layers of materials or may have one or more completed or partially completed structures formed on or in the substrate 400. For example, the substrate 400 may include a first dielectric layer 412, such as silicon oxide, a low-k material (e.g., a material having a dielectric constant less than silicon oxide, or less than about 3.9), or the like. The feature 402 may be formed in the first dielectric layer 412. In some embodiments, the first dielectric layer 412 may be disposed atop a second dielectric layer 414, such as silicon oxide, silicon nitride, silicon carbide, or the like. A conductive material (e.g., conductive material 420) may be disposed in the second dielectric layer 414 and may be aligned with the feature 402 such that the feature 402, when filled with a conductive material, provides an electrical path to and from the conductive material. For example, the conductive material may be part of a line or via to which the interconnect is coupled.

The feature 402 may be any opening, such as a via, trench, dual damascene structure, or the like. In some embodiments, the feature 402 may have a high aspect ratio, e.g., an aspect ratio of about 5:1 or more. As used herein, the aspect ratio is the ratio of a depth of the feature to a width of the feature. The feature 402 may be formed by etching the substrate 400 using any suitable etch process. The feature 402 includes a bottom surface 408 and sidewalls 410.

Figure 4B:
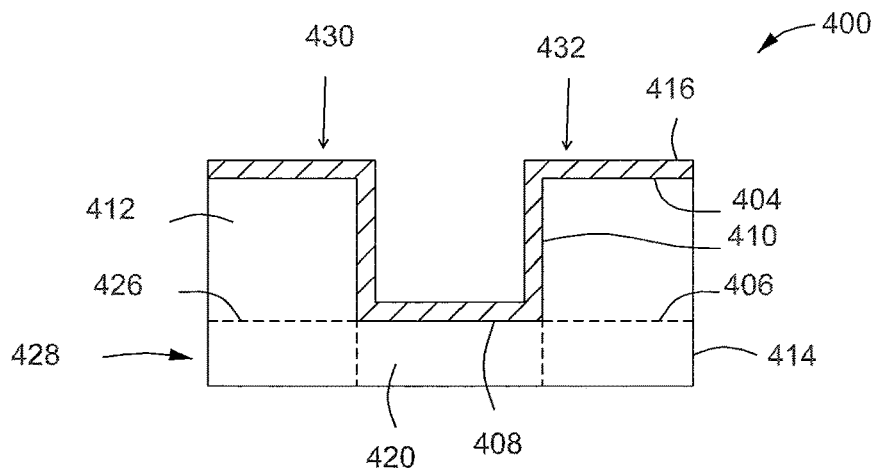
Figure 4C:
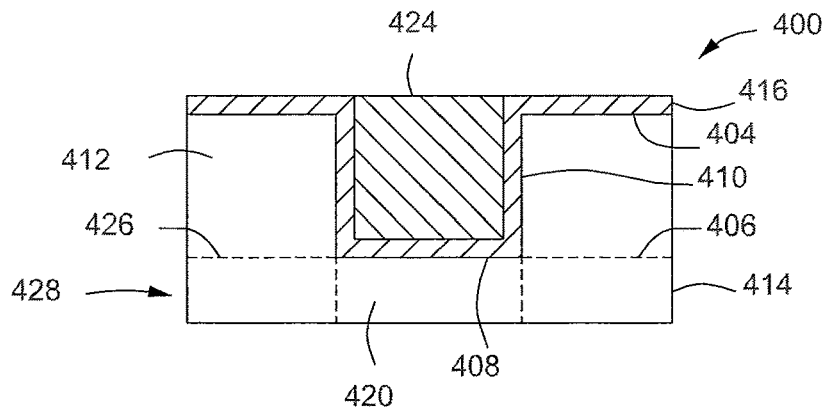

In some embodiments, and as illustrated by dotted lines in FIGS. 4A-4C, the feature 402 may extend completely through the substrate 400 and an upper surface 426 of a second substrate 428 and may form the bottom surface 408 of the feature 402. The second substrate 428 may be disposed adjacent to the second surface 406 of the substrate 400. Further (and also illustrated by dotted lines), a conductive material (e.g., conductive material 420), for example as part of a device, such as a logic device or the like, or an electrical path to a device requiring electrical connectivity, such as a gate, a contact pad, a conductive line or via, or the like, may be disposed in the upper surface 426 of the second substrate 428 and aligned with the feature 402.

The method 100 begins at 102 by depositing a layer of material 416 on a substrate 400 by exposing the substrate 400 to a reactive species generated from a remote plasma source and a first precursor, wherein the reactive species reacts with the first precursor (the combination of the reactive species and the first precursor is hereinafter referred to as the reactive precursor 430), as depicted in FIG. 4B. In some embodiments, the deposited layer of material 416 may be a suitable semiconductor processing material. In some embodiments, the deposited layer of material 416 may be a dielectric material. In some embodiments, the deposited layer of material 416 may be a metal oxide material such as hafnium oxide, tantalum oxide, manganese oxide, or the like. In some embodiments, the deposited layer of material 416 may be a silicon-containing material, such as silicon carbide (SiC), silicon nitride (SiN), silicon oxide (SiO), silicon oxynitride (SiON), silicon oxycarbide (SiOC) or the like. In some embodiments, the layer of material 416 may be deposited in the process chamber using chemical vapor deposition (CVD), atomic layer deposition, or molecular layer deposition (MLD).

The reactive species is produced by a reactive species precursor introduced into a plasma region of the processing chamber that is separate or removed from the processing region of the chamber in which the substrate resides. The reactive species precursor may include one or more of several precursor materials. For example, the reactive species precursor may be one or more inert gases including argon, helium, nitrogen, etc. Additional gases may alternatively or additionally be used, and may include ammonia ($NH_3$), hydrogen, or nitrogen and/or hydrogen-containing gases. In some embodiments, the reactive species precursor may exclusively include inert gases.

Figure 3:
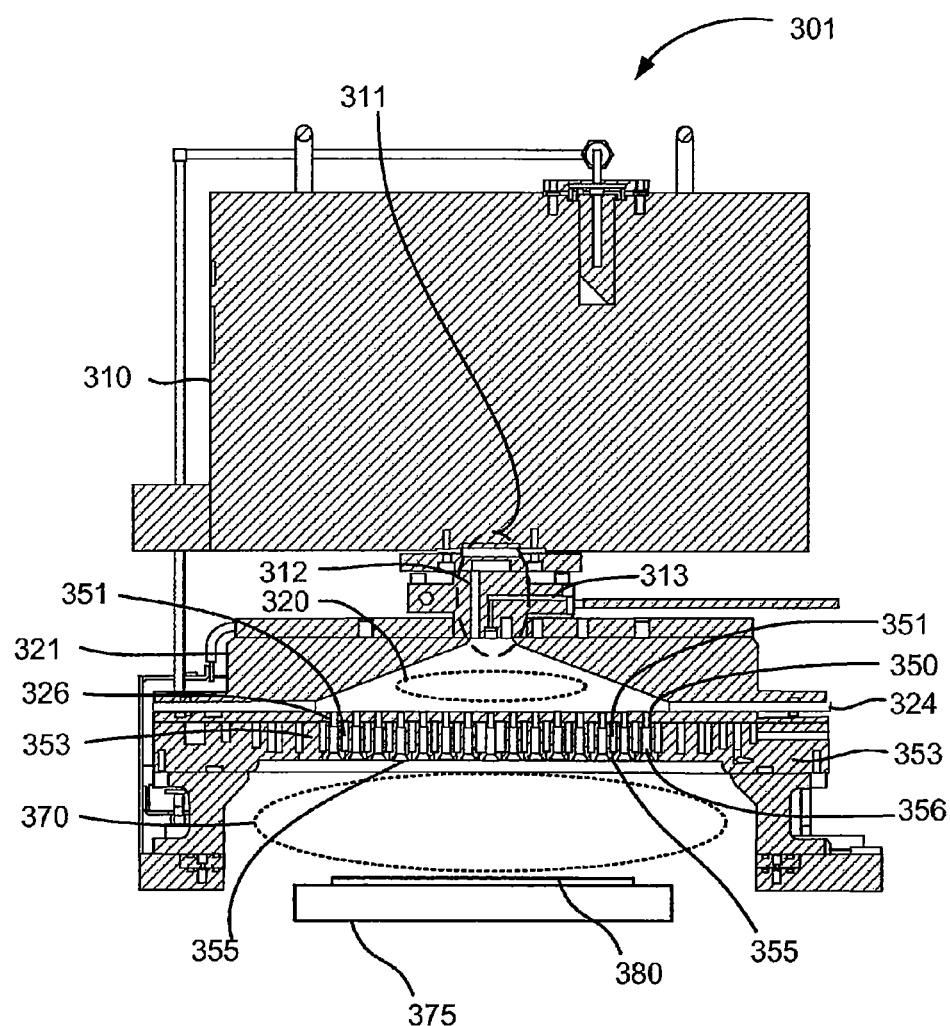
FIG. 3 is a schematic cross sectional view of an example of a process chamber suitable for performing a method of depositing a material on a substrate in accordance with some embodiments of the present disclosure.

The separate plasma region may also be referred to as a remote plasma region or remote plasma source and may be within a distinct module separate from the processing chamber, or as a compartment within the processing chamber for example as shown in FIG. 3. A plasma may be formed within the remote plasma region, generating the reactive species from the reactive species precursor. The generated reactive species is directed into the substrate processing region in a number of ways, including with a pressure differential, generated electric field, or some other known mechanism for directing the flow of ions and/or electrons into the processing region.

Before, after, or concurrently with directing the reactive species into the substrate processing region, a first precursor may be introduced into the substrate processing region. The first precursor is introduced into the processing chamber in a vapor, or substantially vapor, form. In some embodiments, the first precursor is a silicon-containing precursor. In some embodiments, the silicon-containing precursor may be silanes and polysilanes that include or exclusively consist of silicon-silicon and silicon-hydrogen bonds. Exemplary precursors may include at least one silicon-silicon bond, at least two silicon-silicon bonds, at least three silicon-silicon bonds, etc. For example, the silicon-containing precursor may be selected from any of the polysilane homologues beginning with disilane. The silicon-containing precursor may also be selected from a variety of isomers of the polysilanes. For example, if the silicon-containing precursor has five silicon atoms, the composition could include any of n-pentasilane, isopentasilane, neopentasilane, 2-silyltetrasilane, 2,2-disilyltrisilane, etc. The silicon-containing precursor may include cyclic forms or cyclosilanes, such as cyclohexasilane, for example. The polysilanes may also include any saturated or unsaturated compound such as silenes and silynes. The silicon-containing precursor may also be of a general formula such as SixHy where X may be any number of two or greater up to infinity, and Y may be any number of two or greater up to infinity. For example, such a minimal formula would denote disilyne ($Si_2H_2$). Y may also be any factor based on X. For example, Y may be 2X, or 2X+N, where n=2, 0, −2, −4, −6, etc., or N may be any number less than or equal to 2. Exemplary silanes can include disilane, tetrasilane, cyclohexasilane, or the like.

The reactive species and the first precursor may be reacted in the substrate processing region to form a dielectric layer, such as a silicon based dielectric layer, on the substrate. The formed layer of material may be initially flowable when formed or when deposited initially, which may allow the material to flow down into trenches to fill defined patterns on the substrate. The dielectric material may be based on reactions between the first reactive species and the silicon-containing precursor. The reactive species precursor and the first precursor may begin reacting directly upon contacting one another, and accordingly the reactive species precursor and first precursor may be separated until entering the substrate processing region. Such separation may be performed by components such as a dual-channel showerhead as described further below. The showerhead may be configured to maintain separation of the reactive species precursor and first precursor so as to prevent the reactive species precursor and first precursor from contacting one another until they enter or are delivered into the substrate processing region.

Flowability of the dielectric material may be based on a combination of process parameters including the temperature and pressure of the process in relation to the first precursor, plasma power used, and distance between the showerhead or mechanism delivering the reactive species precursor and first precursor and the substrate on which the films are to be formed. During the deposition, the substrate processing region may be relatively, substantially, or completely plasma-free. Although the reactive species may be delivered into the substrate processing region, the plasma used to generate the reactive species may be contained externally to the substrate processing region. The greatest amount of reactions may occur directly under the showerhead, or where the reactive species precursor and first precursor initially interact. The reactive species may have had the least amount of time to recombine, and thus greater reactions between the reactive species precursor and first precursor may occur. These gas phase reactions may be affected further by the material used. Silicon-silicon bonds may be weaker bonds than silicon-hydrogen, silicon-oxygen, and other silicon-based bonds. Accordingly, where these greater reactions occur, or where a higher plasma power is utilized, for the silicon-containing precursors of the present technology, a greater number of bonds may be broken. As a possible result, the dielectric material formed may have reduced or no flowability when deposited on the substrate. During the deposition process, the substrate may be maintained at or below about 500° C., and may be maintained at or below about 400° C., 300° C., 200° C., 100° C., 80° C., 75° C., 50° C., 25° C., 10° C., 0° C., −10° C., −20° C., −30° C., or less, between about 30° C. and −30° C., etc. In some embodiments, the substrate or the substrate support pedestal is controlled from about −150 degrees Celsius to about 500 degrees Celsius. The processing chamber may be maintained at or below about 100 Torr during the processes, and may be maintained at or below about 50 Torr, 25 Torr, 15 Torr, 5 Torr, 1 Torr, 0.1 Torr, etc., or between about 0.1 mTorr and about 10 Torr, or between about 0.05 to about 2 Torr. The temperature and pressure may also be set based at least partially on the vapor pressure of the precursors being used. As one non-limiting example, if tetrasilane is used as the first precursor, and the chamber temperature is about −10° C., the vapor pressure of tetrasilane may be below about 3 Torr. As such, if the chamber pressure is greater than about 3 Torr, then condensation of the tetrasilane may occur. The interaction of the reactive species with the tetrasilane may also impart energy that overcomes the condensation point. The plasma source used may include plasma generated in the chamber, but remote from and fluidly coupled with the substrate processing region, or alternatively generated in a module separate from but fluidly coupled with the processing chamber.

In some embodiments, the layer of material 416 is deposited to a thickness suitable for treatment, as described at 104 below, of all, or substantially all, of the deposited layer of material 416. For example, in some embodiments, the layer of material 416 is deposited to a thickness of about 5 angstroms to about 25 angstroms per deposition cycle. For example, in some embodiments, a 20 Å thick layer of the material may be deposited during a 1 to 2 second interval, and the treatment of the 20 Å thick layer of the material may be carried out for about 100 milliseconds of the 1 to 2 second interval.

Next, at 104, all, or substantially all, of the deposited layer of material 416 is treated by exposing the substrate 400 to a plasma 432 generated within the processing chamber from a second plasma source. As used herein treatment of all, or substantially all, of the deposited layer of material 416 refers to treating all, or substantially all of the exposed surface area of the deposited layer of material 416 and all, or substantially all, of the thickness of the deposited layer of material 416. The energetic ions in the plasma 432 treat the deposited layer of material 416 by breaking or weakening the bonds within the deposited layer of material 416.

In some embodiments, the plasma 432 is formed using a process gas (i.e. treatment gas). In some embodiments, the process gas is introduced directly into the substrate processing region. In some embodiments, the process gas is introduced into the substrate processing region via the remote plasma region. In some embodiments, the process gas is an inert gas such as helium (He), argon (Ar), neon (Ne), krypton (Kr), nitrogen ($N_2$), ammonia ($NH_3$), or any combination of these gases. In some embodiments, the process gas may be the same gas as the reactive species precursor gas described above. In some embodiments, the choice of the process gas is dependent on the deposited layer of material 416. For example, the choice of the process gas can be dependent on providing the deposited layer of material 416 with predetermined film properties. The inventors have observed that different film properties can be achieved by varying the treatment species in the plasma.

During the method 100, at least one of the remote plasma source or the second plasma source is pulsed to control periods of depositing the layer of material 416 and periods of treating the layer of material 416. The inventors have observed that pulsing the remote plasma source helps to control the deposition thickness and to separate deposition and treatment processes. The inventors have observed that pulsing the second plasma source helps to control the treatment time and treatment dose The inventors have observed that pulsing at least one of the remote plasma source or the second plasma source can break the weak bonds of the film and incorporate species into the film (e.g. use nitrogen ($N_2$) to treat a deposited SiNH film by breaking silicon-hydrogen (Si—H) bonds and incorporate more nitrogen (N) species into the film). The inventors have observed that pulsing at least one of the remote plasma source or the second plasma source improves film properties of the deposited layer of material 416, such as porosity, film shrinkage, film stress, and wet etch rate ratio (WERR), without additional processing steps such as curing or annealing. For example, the method 100 improves the thermal budget to less than about 450 degrees Celsius, improves the wet etch rate ratio (WERR) to less than about 2, and improves film shrinkage to less than about 10 percent. The pulsing also increases electron density and plasma reactivity, allowing precursor molecules with strong bonds to be cracked. The cracked species can be used to treat the deposited layer of material 416 and improve the film properties listed above. In addition, during the off period of the pulsing, the cracked molecules can recombine to form new larger molecules that can be used during film deposition.

In some embodiments, a suitable plasma power source, operable in a continuous wave (CW) or pulsed mode, is coupled to the remote plasma source. In some embodiments, a suitable plasma power source, operable in a continuous wave (CW) or pulsed mode, is coupled to the second plasma source. In some embodiments, the plasma power source may be an RF power source, a microwave power source, pulsed RF power source or pulsed microwave power source.

In some embodiments, the plasma power source coupled to the remote plasma source may be capable of producing up to 3000 W at a tunable frequency in a range from about 50 KHz to about 13.56 MHz. When in pulse mode, the plasma power source may be pulsed at a pulse frequency of up to about 100 KHz, or in some embodiments, between about 1 Hz to about 100 KHz. The plasma power source may be operated at a duty cycle (e.g., the percentage of on time during the total of on time and off time in a given cycle) of between about 0.1% and about 100%.

In some embodiments, the plasma power source coupled to the second plasma source generally may be capable of producing up to 1500 W at a frequency of approximately 13.56 MHz. When in pulse mode, the plasma power source may be pulsed at a pulse frequency of up to about 100 kHz, or in some embodiments, between about 1 Hz to about 100 KHz. The plasma power source may be operated at a duty cycle (e.g., the percentage of on time during the total of on time and off time in a given cycle) of between about 0.1% and about 100%

In some embodiments, the pulsing of the remote plasma source and/or the second plasma source may be controlled by adjusting the length of time of the treatment of the deposited layer of material 416. In some embodiments, the pulsing of the remote plasma source and/or the second plasma source may be controlled by adjusting the pulse frequency of the pulsed plasma. In some embodiments, the pulsing of the remote plasma source and/or the second plasma source may be controlled by adjusting the duty cycle of the pulsing of the plasma. In some embodiments, the pulsing of the remote plasma source and/or the second plasma source may be controlled by adjusting the power applied to pulse the remote plasma source and/or the second plasma source. In some embodiments, the pulsing of the remote plasma source and/or the second plasma source may be controlled by adjusting a treatment gas flow.

FIGS. 2A-2I depict a graph in which elapsed time is shown on the horizontal axis and applied power is shown on the vertical axis. FIGS. 2A-2I depict embodiments of the current disclosure in which at least one of the remote plasma source or the second plasma source is pulsed to control periods of depositing the layer of material 416 and periods of treating the layer of material 416. Line 202 represents the remote plasma source (i.e. the deposition of a layer of material 416 on the substrate 400) and line 204 represents the second plasma source (i.e. the treatment of the layer of material 416 deposited on the substrate 400).

Figure 2A:
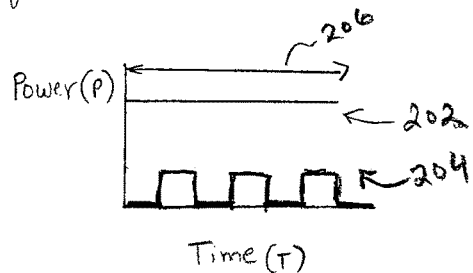
FIG. 2A-2I depict a power vs. time graph of a method for processing a substrate in accordance with some embodiments of the present disclosure.
Figure 2B:
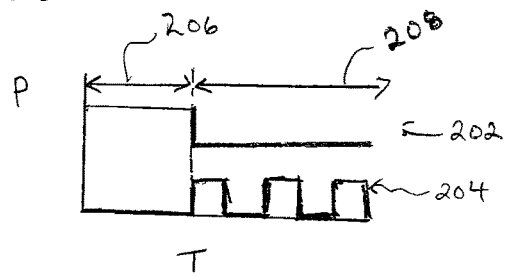
Figure 2C:
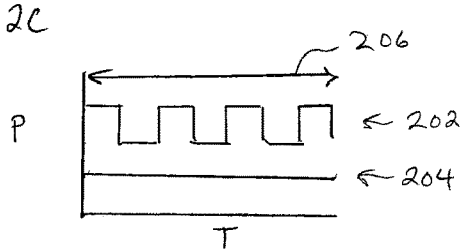

In some embodiments, as depicted in FIGS. 2A-2C one of the remote plasma source (at line 202) or the second plasma source (at line 204) is operated in a continuous wave (CW) mode and the other is pulsed. In some embodiments, as depicted in FIG. 2A, the remote plasma source (at line 202) is operated in a continuous wave (CW) mode for a first interval 206 to deposit the layer of material 416 and the second plasma source (at line 204) is pulsed during the first interval 206 to treat the deposited layer of material 416 while depositing additional layers of material 416. The first interval 206 is an amount of time suitable for depositing a predetermined amount of the layer of material 416 and treating all, or substantially all, of the layer of material 416.

In some embodiments, as depicted in FIG. 2B, the remote plasma source (at line 202) is operated in a continuous wave (CW) mode for a first interval 206 to deposit the layer of material 416 and turned off for a second interval 208 following the first interval 206. The second plasma source (at line 204) is pulsed during the second interval 208 to treat the deposited layer of material 416 while depositing additional layers of material 416. The first interval 206 is an amount of time suitable for depositing a predetermined amount of the layer of material 416. The second interval 208 is an amount of time suitable for depositing an additional predetermined amount of the layer of material 416 and treating all, or substantially all, of the layer of material 416.

In some embodiments, as depicted in FIG. 2C, the remote plasma source (at line 202) is pulsed for a first interval 206 to deposit the layer of material 416. The second plasma source (at line 204) is operated in a continuous wave (CW) mode during the first interval 206 to continuously treat the deposited layer of material 416. The first interval 206 is an amount of time suitable for depositing a predetermined amount of the layer of material 416 and treating all, or substantially all, of the layer of material 416.

Figure 2D:
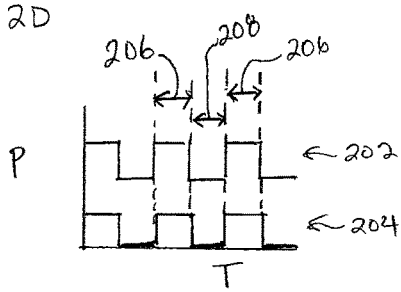

In some embodiments, as depicted in FIGS. 2D-2I both of the remote plasma source (at line 202) and the second plasma source (at line 204) are pulsed. In some embodiments, as depicted in FIG. 2D, the remote plasma source (at line 202) and the second plasma source (at line 204) are pulsed in phase such that the remote plasma source and the second plasma source are simultaneously on during a first interval 206 and simultaneously off during a second interval 208 to simultaneously deposit and treat the layer of material 416. The first interval 206 is an amount of time suitable for depositing a predetermined amount of the layer of material 416 and treating all, or substantially all, of the layer of material 416.

Figure 2E:
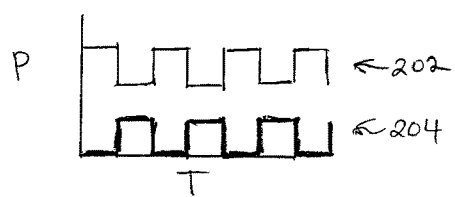

In some embodiments, as depicted in FIG. 2E, the remote plasma source (at line 202) and the second plasma source (at line 204) are pulsed out of phase such that when the remote plasma source is on the second plasma source is off and when the remote plasma source is off the second plasma source is on. The embodiment depicted in FIG. 2E allows for deposition of the layer of material 416 and then subsequent treatment of the deposited layer of material 416, without depositing additional layers of the material 416

Figure 2F:
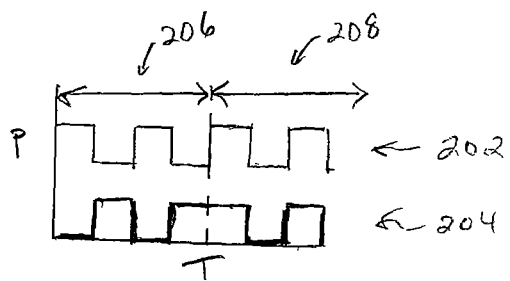

In some embodiments, as depicted in FIG. 2F, the remote plasma source (at line 202) and the second plasma source (at line 204) are pulsed out of phase for a first interval 206 such that when the remote plasma source is on the second plasma source is off and when the remote plasma source is off the second plasma source is on. The embodiment depicted in FIG. 2F allows for alternating deposition of the layer of material 416 and treatment of the layer of material 416 without depositing additional layers of the material 416. The remote plasma source (at line 202) and the second plasma source (at line 204) are then pulsed in phase for a second interval such that when the remote plasma source is on the second plasma source is on and when the remote plasma source is off the second plasma source is off. The embodiment depicted in FIG. 2F allows for simultaneously depositing the layer of material 416 and treating the deposited layer of material 416. The first interval 206 is an amount of time suitable for depositing a predetermined amount of the layer of material 416 and then treating all, or substantially all, of the layer of material 416. The second interval 208 is an amount of time suitable for depositing a predetermined amount of the layer of material 416 and simultaneously treating all, or substantially all, of the layer of material 416.

Figure 2G:
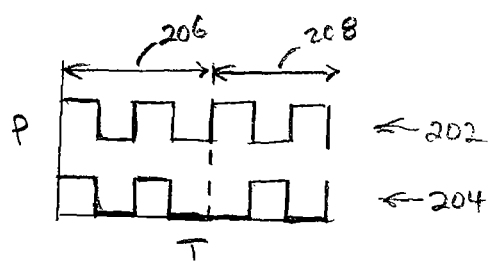

In some embodiments, as depicted in FIG. 2G, the remote plasma source (at line 202) and the second plasma source (at line 204) are pulsed in phase for a for a first interval 206 such that when the remote plasma source is on the second plasma source is on and when the remote plasma source is off the second plasma source is off. The embodiment depicted in FIG. 2G allows for simultaneously depositing the layer of material 416 and treating the deposited layer of material 416. The remote plasma source (at line 202) and the second plasma source (at line 204) are then pulsed out of phase for a second interval such that when the remote plasma source is on the second plasma source is off and when the remote plasma source is off the second plasma source is on to deposit and treat a layer of the material 416. The first interval 206 is an amount of time suitable for depositing a predetermined amount of the layer of material 416 and simultaneously treating all, or substantially all, of the layer of material 416. The second interval 208 is an amount of time suitable for depositing a predetermined amount of the layer of material 416 and then treating all, or substantially all, of the layer of material 416.

Figure 2H:
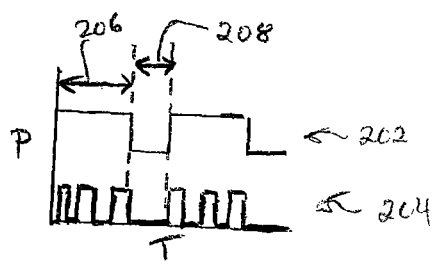

In some embodiments, as depicted in FIG. 2H, the remote plasma source (at line 202) is pulsed on for a first interval 206 and pulsed off for a second interval 208. The second plasma source (at line 204) is pulsed on and off multiple times during the first interval 206 and is off during the second interval 208. The embodiment depicted in FIG. 2H allows for depositing the layer of material 416 while treating the deposited layer of material 416 for portions of the first interval 206. The first interval 206 is an amount of time suitable for depositing a predetermined amount of the layer of material 416 and treating all, or substantially all, of the layer of material 416. The second interval 208 is an amount of time suitable for allowing reactive species in the processing chamber to dissipate.

Figure 2I:
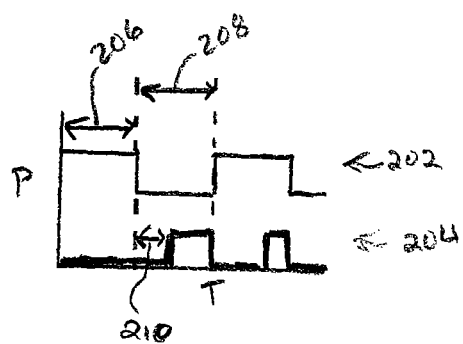

In some embodiments, as depicted in FIG. 2I, the remote plasma source (at line 202) is pulsed on for a first interval 206 and pulsed off for a second interval 208 and the second plasma source (at line 204) is pulsed on a predetermined time 210 after the first interval 206 and during the second interval 208. The embodiment depicted in FIG. 2I allows for depositing the layer of material 416 and then allowing the reactive precursor 430 to dissipate prior to treating the deposited layer of material 416. The first interval 206 is an amount of time suitable for depositing a predetermined amount of the layer of material 416. The predetermined time 210 after the first interval 206 is an amount of time suitable for allowing the reactive precursor 430 to dissipate.

In some embodiments, 102-104 are each repeated until a predetermined thickness of the layer of material 416 is deposited and treated on the substrate 400. Following deposition and treatment of a predetermined thickness of the layer of material 416, the method 100 generally ends. In some embodiments, the method 100 is repeated to fill the feature 402 with the layer of material 416. In some embodiments, a fill material 424, for example a conductive material, may be deposited within the feature 402, for example via a chemical vapor deposition. The feature 402 may be filled above the level of the upper surface of the substrate 400 and the deposited layer of material 416 and the fill material 424 may remain on the upper surface of the substrate 400. Accordingly, techniques, such as wet clean in an acidic solution, chemical or electrochemical mechanical polishing, or the like may be used to remove excess deposited material from the upper surface, such that the feature 402 is filled up to about an equivalent level with the upper surface of the substrate, as depicted in FIG. 4C.

Deposition chambers that may implement embodiments of the present disclosure may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the disclosure include the CENTURA ULTIMA® HDP-CVD chambers/systems, and PRODUCER® PECVD chambers/systems, available from Applied Materials, Inc. of Santa Clara, Calif.

FIG. 3 is a schematic cross sectional view of an example of a process chamber 301 suitable for performing a method of depositing a material on a substrate in accordance with some embodiments of the present disclosure.

A remote plasma system (RPS) 310 may process a gas which then travels through a gas inlet assembly 311. Two distinct gas supply channels may be present within the gas inlet assembly 311. A first channel 312 may carry a gas that passes through the remote plasma system (RPS) 310, while a second channel 313 may bypass the remote plasma system (RPS) 310. The first channel 312 and the second channel 313 may be used for a reactive species precursor or a treatment gas in disclosed embodiments. The lid (or conductive top portion) 321 and a perforated partition, such as showerhead 353, are shown with an insulating ring 324 disposed between, which may allow an AC potential to be applied to the lid 321 relative to showerhead 353. The reactive species precursor may travel through first channel 312 into chamber plasma region 320 and may be excited by a plasma in chamber plasma region 320 alone or in combination with remote plasma system (RPS) 310. The combination of chamber plasma region 320 and/or remote plasma system (RPS) 310 may be referred to as a remote plasma system herein. The perforated partition or showerhead 353 may separate chamber plasma region 320 from a substrate processing region 370 beneath showerhead 353. Showerhead 353 may allow a plasma present in chamber plasma region 320 to avoid directly exciting gases in substrate processing region 370, while still allowing excited species to travel from chamber plasma region 320 into substrate processing region 370.

Showerhead 353 may be positioned between chamber plasma region 320 and substrate processing region 370 and allow a first reactive species or excited derivatives of precursors or other gases created within the chamber plasma region 320 to pass through a plurality of through-holes 356 that traverse the thickness of the plate or plates included in the showerhead. The showerhead 353 may also have one or more hollow volumes 351 that can be filled with a precursor in the form of a vapor or gas, such as a first precursor, and pass through small holes 355 into substrate processing region 370, but not directly into chamber plasma region 320. Showerhead 353 may be thicker than the length of the smallest diameter 350 of the through-holes 356 in disclosed embodiments. In order to maintain a significant concentration of excited species penetrating from chamber plasma region 320 to substrate processing region 370, the length 326 of the smallest diameter 350 of the through-holes may be restricted by forming larger diameter portions of through-holes 356 part way through the showerhead 353. The length of the smallest diameter 350 of the through-holes 356 may be the same order of magnitude as the smallest diameter of the through-holes 356 or less in disclosed embodiments.

In the embodiment shown, showerhead 353 may also distribute, via through-holes 356, process gases which contain a plasma vapor/gas such as argon, for example. Additionally, the showerhead 353 may distribute, via smaller holes 355, a precursor that is maintained separately from the chamber plasma region 320. The process gas or gases and the precursor may be maintained fluidly separate via the showerhead 353 until the precursors separately enter the substrate processing region 370. The precursors may contact one another once they enter the processing region and react to form a flowable dielectric material on a substrate 380.

In embodiments, the number of through-holes 356 may be between about 60 and about 2000. Through-holes 356 may have a variety of shapes but may be made round. The smallest diameter 350 of through-holes 356 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 355 used to introduce a gas into substrate processing region 370 may be between about 100 and about 5000 or between about 500 and about 2000 in different embodiments. The diameter of the small holes 355 may be between about 0.1 mm and about 2 mm.

An exemplary film may be created on a substrate supported by a pedestal, such as pedestal 375 having a substrate 380 disposed on the pedestal 375, within substrate processing region 370 when a reactive species arriving through through-holes 356 in showerhead 353 combine with, for example, a silicon-containing precursor arriving through the small holes 355 originating from hollow volumes 351. Though substrate processing region 370 may be equipped to support a plasma for other processes such as curing, no plasma may be present during the growth or deposition of the exemplary films.

A plasma may be ignited either in chamber plasma region 320 above showerhead 353 or substrate processing region 370 below showerhead 353. Alternatively, no plasma may be formed in any portion of the chamber, and may be only formed in remote plasma system (RPS) 310. A plasma may be present in chamber plasma region 320 to produce radical reactive species, such as from an inflow of one or more of argon, helium, hydrogen, or ammonia. An AC voltage typically in the radio frequency (RF) range is applied between the conductive top portion, such as lid 321, of the processing chamber and showerhead 353 to ignite a plasma in chamber plasma region 320 during deposition. An RF power supply generates a high RF frequency of 13.56 MHz but may also generate other frequencies alone or in combination with the 13.56 MHz frequency. The plasma in chamber plasma region 320 may be pulsed as described above. For example, in some embodiments, a power source operable in a continuous wave (CW) mode or pulsed mode, such as a microwave power source, a RF power source, or a DC power source is coupled to the remote plasma system (RPS) 310.

The top plasma may be left at low or no power when the bottom plasma in the substrate processing region 370 may be turned on during the formation of the dielectric layer. A plasma in substrate processing region 370 may be ignited by applying an AC voltage between showerhead 353 and the pedestal 375 or bottom of the chamber. The plasma in substrate processing region 370 may be pulsed as described above. For example, in some embodiments, a power source operable in a continuous wave (CW) mode or pulsed mode, such as a microwave power source, a RF power source, or a DC power source is coupled to the pedestal 375.

The pedestal 375 may be moveable, and may be configured to be raised or lowered in disclosed embodiments, and may similarly be configured to rotate. The pedestal 375 may have a heat exchange channel through which a heat exchange fluid flows to control the temperature of the substrate. The heat exchange channel allows the substrate temperature to be cooled or heated to maintain relatively low temperatures, such as from about 0° C. or lower up to about 200° C. or higher. The heat exchange fluid may comprise ethylene glycol, water, or some other fluid capable of introducing or removing heat from the system. The wafer support platter of the pedestal may also be resistively heated in order to achieve relatively high temperatures from about 200° C. or lower up to about 1100° C. or higher using an embedded resistive heating element. An outer portion of the heater element may run adjacent to a perimeter of the support platter, while an inner portion runs on the path of a concentric circle having a smaller radius. The resistive heating element may additionally be coiled through the platter to provide more uniform temperatures. The wiring to the heater element may pass through the stem of the pedestal.

The chamber plasma region or a region in an remote plasma system (RPS) may be referred to as a remote plasma region. In embodiments, the radical precursor, e.g. an argon precursor, may be created in the remote plasma region and travel into the substrate processing region to combine with the silicon-containing precursor. In embodiments, the silicon-containing precursor is excited only by the radical-argon precursor. Plasma power may essentially be applied only to the remote plasma region, in embodiments, to ensure that the radical-argon precursor provides the dominant excitation to the silicon-containing precursor.

In embodiments employing a chamber plasma region, the excited reactive species may be generated in a section of the substrate processing region partitioned from a deposition region. The deposition region, also known herein as the substrate processing region, may be where the reactive species mix and react with the first precursor to deposit dielectric material on the substrate, e.g., a semiconductor wafer. The excited reactive species may also be accompanied by additional gases including other inert gases or ammonia, for example. The first precursor may not pass through a plasma before entering the substrate plasma region, in embodiments. The substrate processing region may be described herein as "plasma-free" during the deposition of the dielectric material. "Plasma-free" does not necessarily mean the region is devoid of plasma. Ionized species and free electrons created within the plasma region may travel through pores or apertures in the partition or showerhead, but the first precursor may not be substantially excited by the plasma power applied to the plasma region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating specific features of the forming film. All causes for a plasma having much lower intensity ion density than the chamber plasma region, or a remote plasma region, during the creation of the excited first reactive species do not deviate from the scope of "plasma-free" as used herein.

Plasma power can be a variety of frequencies or a combination of multiple frequencies. In the exemplary processing system, the plasma may be provided by RF power delivered to lid 321 relative to showerhead 353. The plasma power may be capacitively-coupled (CCP) or inductively-coupled (ICP) into the remote plasma region.

While the foregoing is directed to embodiments of the present disclosure, other and further embodiments of the disclosure may be devised without departing from the basic scope thereof.

The invention claimed is:

1. A method of processing a substrate disposed in a processing chamber, comprising:
 (a) depositing a layer of dielectric material on a substrate by exposing the substrate to a first reactive species generated from a remote plasma source and to a first precursor, wherein the first reactive species reacts with the first precursor; and
 (b) treating all, or substantially all, of the deposited layer of dielectric material by breaking at least one chemical bond within the deposited layer of dielectric material by exposing the substrate to a plasma generated within the processing chamber from a second plasma source, wherein at least the remote plasma source is pulsed at least once to control periods of depositing.

2. The method of claim 1, further comprising:
 (c) repeating (a) and (b) until a predetermined thickness of the layer of material is deposited and treated on the substrate.

3. The method of claim 1, wherein the second plasma source is coupled to a substrate support pedestal within the processing chamber.

4. The method of claim 1, wherein the remote plasma source is operated in a continuous wave (CW) mode for a first interval to deposit the layer of material and wherein the second plasma source is pulsed during the first interval to treat the deposited layer of dielectric material while depositing an additional layer of dielectric material.

5. The method of claim 1, wherein the remote plasma source is operated in a continuous wave (CW) mode for a first interval to deposit the layer of dielectric material and turned off for a second interval following the first interval, wherein the second plasma source is off for a first interval and pulsed during the second interval to treat the deposited layer of dielectric material.

6. The method of claim 1, wherein the remote plasma source is pulsed for a first interval to deposit the layer of dielectric material and the second plasma source is operated in a continuous wave (CW) mode during the first interval to continuously treat the deposited layer of dielectric material.

7. The method of claim 1, wherein the remote plasma source and the second plasma source are both pulsed.

8. The method of claim 7, wherein the remote plasma source and the second plasma source are pulsed in phase such that the remote plasma source and the second plasma source are simultaneously on during a first interval and simultaneously off during a second interval to simultaneously deposit the layer of dielectric material and treat the deposited layer of dielectric material.

9. The method of claim 7, wherein the remote plasma source and the second plasma source are pulsed out of phase such that when the remote plasma source is on the second plasma source is off and when the remote plasma source is off the second plasma source is on to deposit the layer of dielectric material and then subsequently treat the deposited layer of dielectric material without depositing additional layers of the dielectric material.

10. The method of claim 7, wherein the remote plasma source and the second plasma source are pulsed out of phase for a first interval such that when the remote plasma source is on the second plasma source is off and when the remote plasma source is off the second plasma source is on and are pulsed in phase for a second interval such that when the remote plasma source is on the second plasma source is on and when the remote plasma source is off the second plasma source is off.

11. The method of claim 7, wherein the remote plasma source and the second plasma source are pulsed in phase for a first interval such that when the remote plasma source is on the second plasma source is on and when the remote plasma source is off the second plasma source is off and are pulsed out of phase for a second interval such that when the remote plasma source is on the second plasma source is off and when the remote plasma source is off the second plasma source is on to deposit and treat a layer of the dielectric material.

12. The method of claim 7, wherein the remote plasma source is pulsed on for a first interval and pulsed off for a second interval and the second plasma source is pulsed on and off multiple times during the first interval and is off during the second interval.

13. The method of claim 7, wherein the remote plasma source is pulsed on for a first interval and pulsed off for a second interval and wherein the second plasma source is pulsed on a predetermined time after the first interval and during the second interval.

14. The method of claim 1, wherein the remote plasma source and the second plasma source are coupled to a RF power source, DC power source, or a microwave power source.

15. The method of claim 1, wherein the deposited layer of dielectric material is one of silicon carbide (SiC), silicon nitride (SiN), silicon oxide (SiO), silicon oxynitride (SiON), silicon oxycarbide (SiOC), or metal oxide.

16. The method of claim 1, wherein the plasma generated within the processing chamber is formed from a second process gas comprising helium (He), argon (Ar), neon (Ne), krypton (Kr), nitrogen ($N_2$), ammonia ($NH_3$), or any combination thereof.

17. The method of claim 1, wherein pulsing the remote plasma source and the second plasma source is controlled by adjusting a pulse frequency, or a duty cycle, or a power applied to the remote plasma source or the second plasma source.

18. The method of claim 1, wherein a temperature of a substrate support pedestal within the processing chamber is controlled from about −150 degrees Celsius to about 500 degrees Celsius.

19. A method of depositing a material on a substrate disposed atop a substrate support pedestal in a process chamber, comprising:
  (a) depositing a layer of dielectric material on a substrate by exposing the substrate to a first reactive species generated from a remote plasma source and to a first precursor, wherein the first reactive species reacts with the first precursor;
  (b) treating all, or substantially all, of the deposited layer of dielectric material by breaking at least one chemical bond within the deposited layer of dielectric material by exposing the substrate to a plasma generated within the processing chamber from a second plasma source; wherein the remote plasma source is pulsed for a first interval and the second plasma source is pulsed for a second interval concurrent with the first interval; and
  (c) repeating (a) and (b) until a predetermined thickness of the dielectric material is deposited and treated on the substrate, wherein a temperature of the substrate support pedestal during (a)-(c) is controlled from about −150 degrees Celsius to about 500 degrees Celsius.

20. A non-transitory computer readable medium having instructions stored thereon that, when executed, cause a method for processing a substrate disposed atop a substrate support pedestal in a processing chamber to be performed, the method comprising:
  (a) depositing a layer of dielectric material on a substrate by exposing the substrate to a first reactive species generated from a remote plasma source and to a first precursor, wherein the first reactive species reacts with the first precursor;
  (b) treating all, or substantially all, of the deposited layer of dielectric material by breaking at least one chemical bond within the deposited layer of dielectric material by exposing the substrate to a plasma generated within the processing chamber from a second plasma source; wherein at least the remote plasma source is pulsed at least once to control periods of depositing; and
  (c) repeating (a) and (b) until a predetermined thickness of the dielectric material is deposited and treated on the substrate, wherein a temperature of the substrate support pedestal during (a)-(c) is controlled from about −150 degrees Celsius to about 500 degrees Celsius.

21. The method of claim 1, further comprising:
processing the substrate within a thermal budget of less than about 450 degrees Celsius.

22. The method of claim 1, wherein the layer of material remains at least partially flowable after deposition or during treatment.

23. The method of claim 19, further comprising:
processing the substrate within a wet etch rate ratio of less than about 2.

24. The method of claim 19, further comprising:
processing the substrate with a film shrinkage of less than about 10%.

* * * * *